United States Patent
Eeh et al.

(10) Patent No.: US 11,201,189 B2
(45) Date of Patent: Dec. 14, 2021

(54) SEMICONDUCTOR DEVICE HAVING RARE EARTH OXIDE LAYER AND METHOD OF MANUFACTURING THE SAME

(71) Applicant: TOSHIBA MEMORY CORPORATION, Tokyo (JP)

(72) Inventors: Youngmin Eeh, Seongnam-si (KR); Toshihiko Nagase, Seoul (KR); Daisuke Watanabe, Seoul (KR); Kazuya Sawada, Seoul (KR); Kenichi Yoshino, Seoul (KR); Tadaaki Oikawa, Seoul (KR); Hiroyuki Ohtori, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/125,759

(22) Filed: Sep. 9, 2018

(65) Prior Publication Data
US 2019/0019841 A1    Jan. 17, 2019

Related U.S. Application Data

(63) Continuation of application No. 15/445,829, filed on Feb. 28, 2017, now abandoned.
(Continued)

(51) Int. Cl.
*H01L 27/22* (2006.01)
*H01L 43/08* (2006.01)
(Continued)

(52) U.S. Cl.
CPC .......... *H01L 27/228* (2013.01); *H01L 43/08* (2013.01); *H01L 43/10* (2013.01); *H01L 43/12* (2013.01)

(58) Field of Classification Search
CPC .................. H01L 43/10; H01L 27/228
See application file for complete search history.

(56) References Cited

U.S. PATENT DOCUMENTS

| 5,731,626 A | 3/1998 | Eaglesham et al. |
| 5,738,938 A | 4/1998 | Kawano et al. |

(Continued)

FOREIGN PATENT DOCUMENTS

| CN | 105684178 A | 6/2016 | |
| EP | 1659645 A1 * | 5/2006 | ............. G01R 33/06 |

(Continued)

OTHER PUBLICATIONS

U.S. Appl. No. 62/394,708; First Named Inventor: Youngmin Eeh; Title: "Semiconductor Device Having Rare Earth Oxide Layer and Method of Manufacturing the Same"; filed Sep. 14, 2016.

(Continued)

*Primary Examiner* — Sarah K Salerno
(74) *Attorney, Agent, or Firm* — Holtz, Holtz & Volek PC

(57) ABSTRACT

A semiconductor device includes a first rare earth oxide layer, a first magnetic layer adjacent to the first rare earth oxide layer, a second rare earth oxide layer, a second magnetic layer adjacent to the second rare earth oxide layer, and a nonmagnetic layer. The first magnetic layer is disposed between the first rare earth oxide layer and the nonmagnetic layer and is oriented in a crystal surface which is the same as a crystal surface of the nonmagnetic layer. The second magnetic layer is disposed between the second rare earth oxide layer and the nonmagnetic layer and is oriented in a crystal surface which is the same as a crystal surface of the nonmagnetic layer. The nonmagnetic layer is disposed between the first magnetic layer and the second magnetic layer.

9 Claims, 12 Drawing Sheets

Related U.S. Application Data

(60) Provisional application No. 62/394,708, filed on Sep. 14, 2016.

(51) Int. Cl.
 *H01L 43/10* (2006.01)
 *H01L 43/12* (2006.01)

(56) References Cited

U.S. PATENT DOCUMENTS

| | | | |
|---|---|---|---|
| 6,522,573 | B2 | 2/2003 | Saito et al. |
| 7,345,855 | B2 | 3/2008 | Parkin |
| 8,098,514 | B2 | 1/2012 | Nagase et al. |
| 8,299,552 | B2 | 10/2012 | Nagase et al. |
| 9,263,668 | B2 | 2/2016 | Choi et al. |
| 2001/0047930 | A1 | 12/2001 | Saito et al. |
| 2002/0037595 | A1 | 3/2002 | Hosotani |
| 2002/0048128 | A1* | 4/2002 | Kamiguchi ............ B82Y 10/00 360/324.1 |
| 2003/0174446 | A1 | 9/2003 | Hasegawa |
| 2005/0023579 | A1 | 2/2005 | Yamazaki |
| 2005/0226036 | A1 | 10/2005 | Aratani et al. |
| 2006/0203398 | A1* | 9/2006 | Ishizone ............... G11B 5/3903 360/324.12 |
| 2006/0240656 | A1 | 10/2006 | Ahn |
| 2006/0258538 | A1* | 11/2006 | Yasuo ................. H01L 39/2461 505/100 |
| 2006/0292395 | A1 | 12/2006 | Mori et al. |
| 2007/0096229 | A1* | 5/2007 | Yoshikawa ............ H01L 43/10 257/421 |
| 2015/0069554 | A1 | 3/2015 | Nakayama et al. |
| 2016/0163971 | A1 | 6/2016 | Jeong |
| 2016/0268496 | A1 | 9/2016 | Yamane et al. |

FOREIGN PATENT DOCUMENTS

| | | |
|---|---|---|
| JP | 2004172645 A | 6/2004 |
| JP | 2004179187 A | 6/2004 |
| JP | 2004214228 A | 7/2004 |
| JP | 2010093157 A | 4/2010 |
| JP | 2010205931 A | 9/2010 |
| JP | 2010251523 A | 11/2010 |
| JP | 2014135449 A | 7/2014 |
| TW | 200541055 A | 12/2005 |
| TW | 201532040 A | 8/2015 |
| WO | 2015136723 A1 | 9/2015 |

OTHER PUBLICATIONS

Bae, et al., "Compositional change of MgO barrier and interface in Co Fe B/Mg O/Co Fe B tunnel", Sep. 3, 2006, 08T316-1~08T316-3.
Burton, et al., "Atomic and electronic structure of the Co Fe B/Mg O interface from first principles", 142507-1-142507-3.
Kolmogorov, et al., "Theoretical study of metal borides stability", Physical Review B 74, 224507 (2006); The American Physical Society, Dec. 26, 2006; pp. 224507-1-224507-14.

* cited by examiner

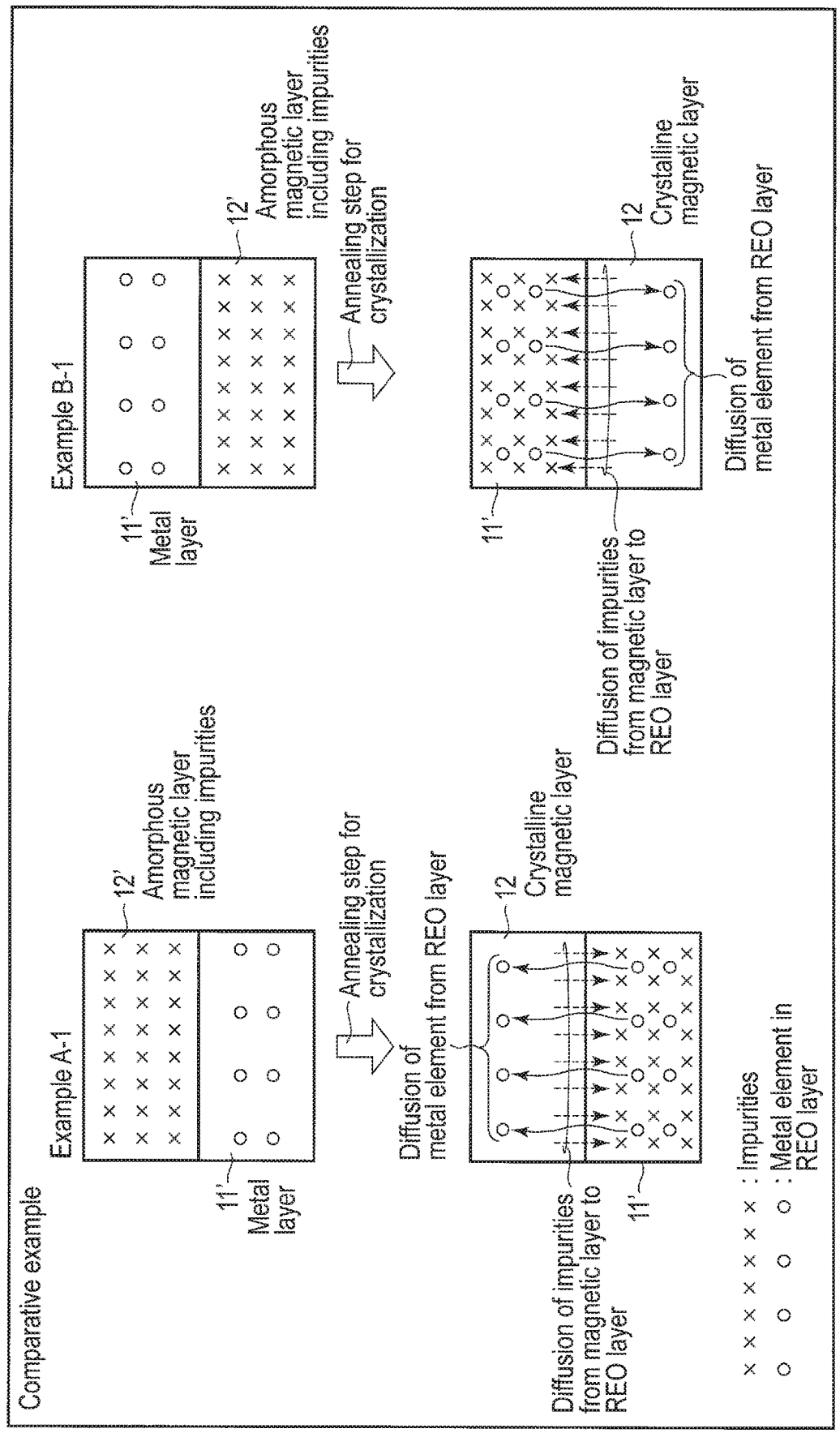
F I G. 3

FIG. 4

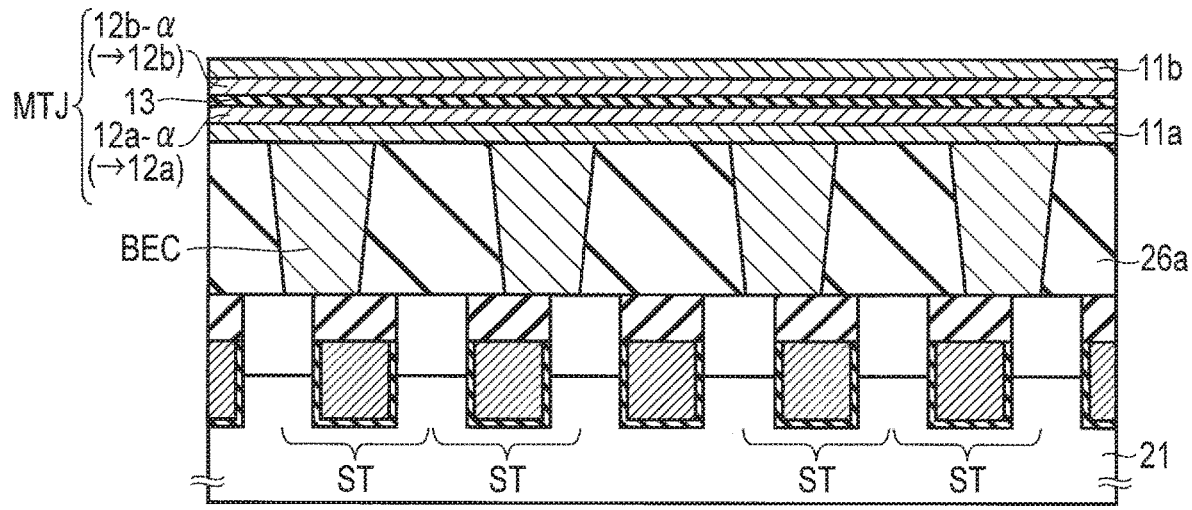
F I G. 22
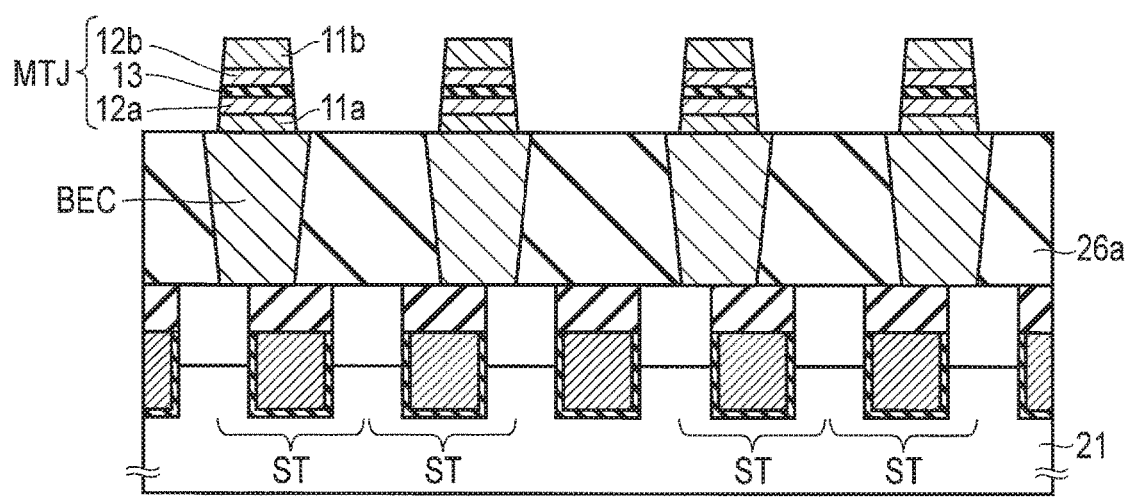
F I G. 23

SEMICONDUCTOR DEVICE HAVING RARE EARTH OXIDE LAYER AND METHOD OF MANUFACTURING THE SAME

CROSS-REFERENCE TO RELATED APPLICATIONS

This application is a Continuation application of U.S. application Ser. No. 15/445,829, filed Feb. 28, 2017, which claims the benefit of U.S. Provisional Application No. 62/394,708, filed Sep. 14, 2016, the entire contents of both of which are incorporated herein by reference.

FIELD

Embodiments described herein relate generally to a semiconductor device having a rare earth oxide layer and a method of manufacturing the same.

BACKGROUND

In a semiconductor device which requires a crystalline layer, the crystalline layer can be obtained by, for example, crystallizing an amorphous layer by heat treatment. In this case, it is important to obtain a good crystalline layer having a preferable orientation.

BRIEF DESCRIPTION OF THE DRAWINGS

FIG. 3 and FIG. 4 show comparative examples.
FIG. 22 and FIG. 23 show a method of manufacturing the MRAM of FIG. 19 to FIG. 21.

DETAILED DESCRIPTION

In general, according to one embodiment, a semiconductor device comprises: a first rare earth oxide layer; a first magnetic layer being adjacent to the first rare earth oxide layer; and a nonmagnetic layer, the first magnetic layer being disposed between the first rare earth oxide layer and the nonmagnetic layer and being oriented in a crystal surface which is the same as a crystal surface of the nonmagnetic layer.

First Embodiment

Figure 1A:
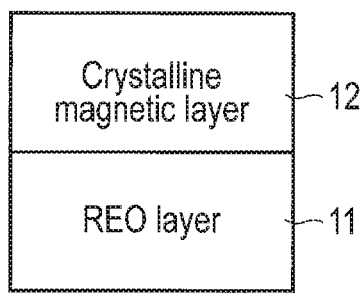
FIG. 1A and FIG. 1B show a first embodiment.
Figure 1B:
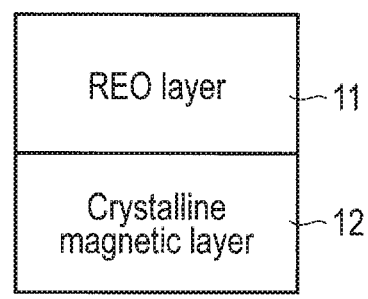

FIG. 1A and FIG. 1B show a semiconductor device according to a first embodiment.

In an example of FIG. 1A, the semiconductor device comprises a rare earth oxide layer (REO layer) 11 and a crystalline magnetic layer 12 above the REO layer 11. In an example of FIG. 1B, the semiconductor device comprises the crystalline magnetic layer 12 and the REO layer 11 above the crystalline magnetic layer 12.

In both of the examples, the crystalline magnetic layer 12 is adjacent to the REO layer 11. It is preferable that the crystalline magnetic layer 12 contact the REO layer 11. In addition, an interfacial layer may exist between the REO layer 11 and the crystalline magnetic layer 12. It should be noted that, as will be described later, the interfacial layer may exist under the condition that it does not influence the crystallization of the crystalline magnetic layer 12.

The REO layer 11 includes at least one of Tb, Gd, Nd, Y, Sm, Pm, Tm, Sc, Ce, Eu, Er, Ho, La, Yb, Lu, Pr, and Dy.

The crystalline magnetic layer 12 includes at least one of Co, Fe, and Ni. For example, if the crystalline magnetic layer 12 is CoFeB, the crystalline magnetic layer 12 has a body-centered cubic (BCC) structure in which a film surface is oriented in a (001) surface. The film surface herein means a surface substantially parallel to the interface between the REO layer 11 and the crystalline magnetic layer 12.

The REO layer 11 and the crystalline magnetic layer 12 include the same impurities. The same impurities are, for example, at least one of B, P, C, Al, Mn, Si, Ta, W, Mo, Cr, Hf, and Ti.

According to the above-described semiconductor device, the crystallization of the crystalline magnetic layer 12 can be promoted.

Figure 2:
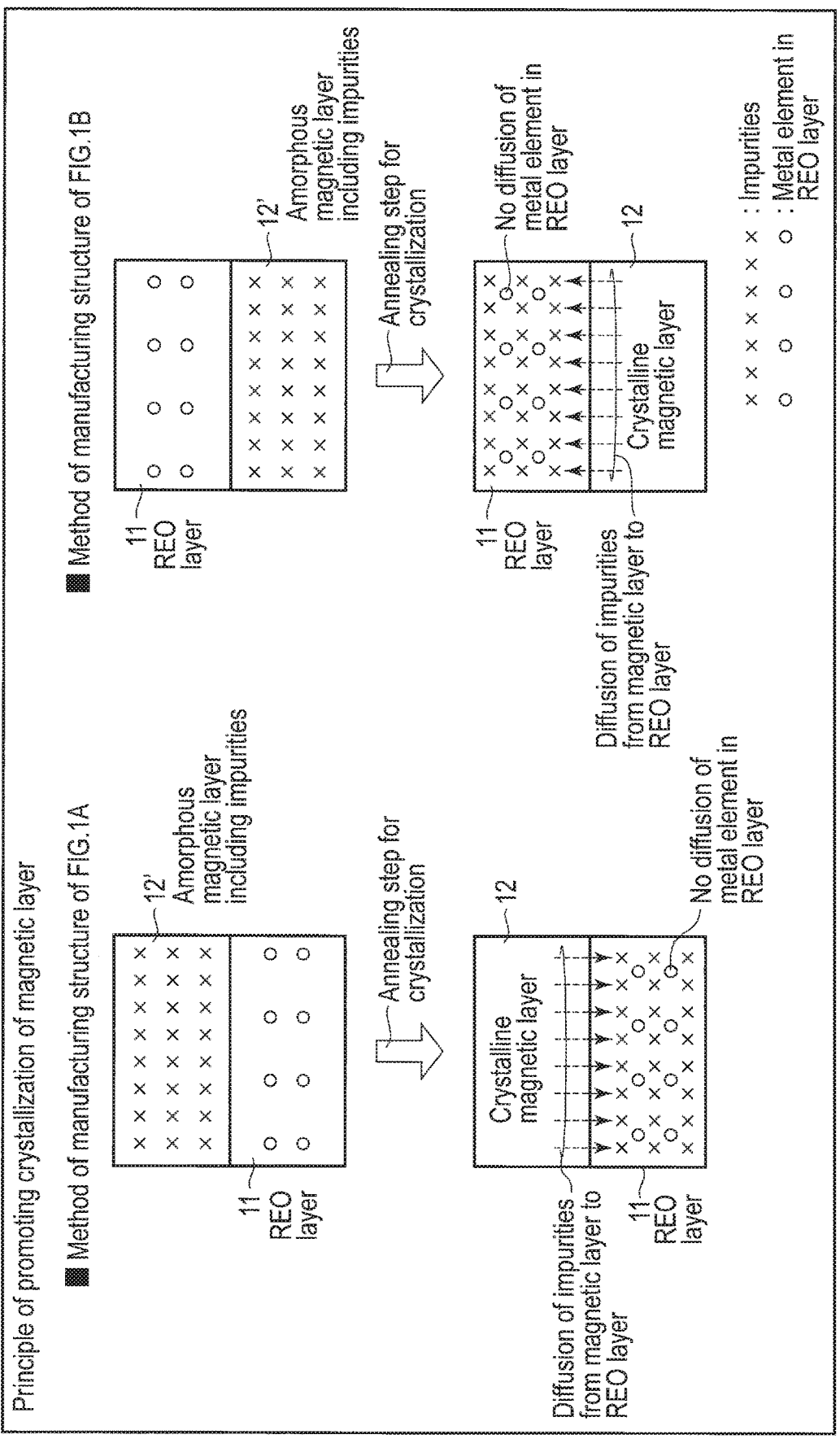
FIG. 2 shows a principle on which a crystalline magnetic layer is obtained.

FIG. 2 shows a principle on which a crystalline magnetic layer is obtained.

In the semiconductor device which requires the crystalline magnetic layer 12, the crystalline magnetic layer 12 can be obtained by, for example, crystallizing an amorphous layer by heat treatment such as annealing. In this case, to promote the crystallization of the crystalline magnetic layer 12, it is necessary to remove impurities included in the amorphous layer in the heat treatment.

The REO layer 11 performs an important role in removing the impurities included in the amorphous layer. That is, the REO layer 11 has a crystal structure in which the space between elements is relatively wide. Accordingly, as shown in the figure, if heat treatment is performed in the semiconductor device having a stacked structure of the REO layer (crystal structure) 11 and an amorphous magnetic layer 12' including impurities, the impurities in the amorphous magnetic layer 12' easily diffuse into the REO layer 11, or other layers via the REO layer 11.

As a result, in the heat treatment, the impurities in the amorphous magnetic layer 12' can be reduced, and the good crystalline magnetic layer 12 can be obtained. Depending on the conditions of the heat treatment or the materials of the REO layer and the amorphous magnetic layer 12', the impurities can be substantially completely removed.

On the other hand, the absolute value of the standard free energy of formation of oxide of the REO layer 11 is large, and the REO layer 11 is extremely stable oxide. That is, in heat treatment such as annealing, even if the temperature of the REO layer 11 rises, rare-earth elements and oxygen elements are hardly dissociated. Accordingly, in heat treatment, the rare-earth elements or the oxygen elements in the REO layer 11 do not diffuse into the crystalline magnetic layer 12 or inhibit the crystallization of the crystalline magnetic layer 12.

In addition, the film surface of the REO layer 11 (the interface between the REO layer 11 and the crystalline magnetic layer 12) has extremely high flatness. This is because the rare-earth elements are large, and thus, when the rare-earth elements and the oxide elements are combined to form the REO 11, the degree of motion of the rare-earth elements is small. That is, when the rare-earth elements and the oxygen elements are combined, the rare-earth elements hardly cohere, and the film surface of the REO layer 11 can be flattened.

The flatness of the film surface of the REO layer 11 is also one of the effective factors in improving various properties, such as perpendicular magnetic anisotropy, of the crystalline magnetic layer 12.

Here, a method of manufacturing the semiconductor device of FIG. 1A and FIG. 1B will be briefly described.

First, a stacked structure of the REO layer 11 and the amorphous magnetic layer 12' including impurities is formed. At this point in time, the REO layer 11 has a crystal structure, and the amorphous magnetic layer 12' has an amorphous structure due to the impurities.

Then, by heat treatment, the impurities in the amorphous magnetic layer 12' are removed, and the amorphous magnetic layer 12' is changed into the crystalline magnetic layer 12. As described above, the impurities in the amorphous magnetic layer 12' diffuse into the REO layer 11 or into other layers via the REO layer 11. At this time, the elements in the REO layer 11 do not diffuse into the crystalline magnetic layer 12.

By the above-described manufacturing method, the crystallization of the crystalline magnetic layer 12 can be promoted.

It should be noted that before the heat treatment, the REO layer 11 does not include impurities in the amorphous magnetic layer 12'. However, after the heat treatment, the REO layer 11 includes impurities diffused from the amorphous magnetic layer 12'. In addition, although the impurities in the amorphous magnetic layer 12' are reduced by the heat treatment, some of the impurities may be left in the crystalline magnetic layer 12 after the heat treatment. In this case, the REO layer 11 and the crystalline magnetic layer 12 include the same impurities.

In addition, if the heat treatment is insufficient, many impurities are left in the crystalline magnetic layer 12, and the crystalline magnetic layer 12 may has a concentration gradient of impurities in the thickness direction (stacked direction). This phenomenon depends on the concentration of impurities in the amorphous magnetic layer 12' before the heat treatment. In this case, a part (an area where the concentration of impurities is high after the heat treatment) of the crystalline magnetic layer 12 may not be crystallized and maintain an amorphous state.

Figure 4:
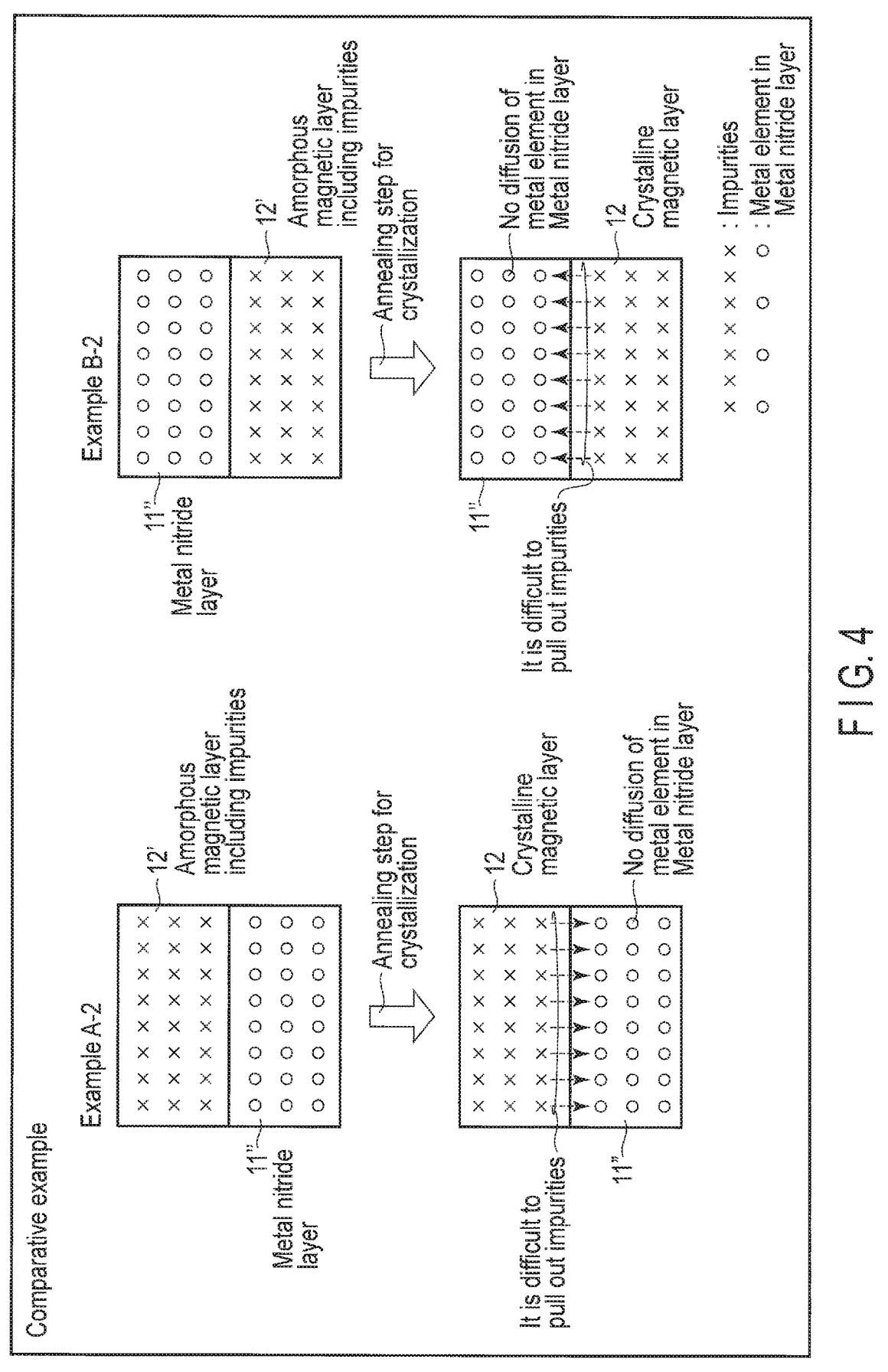

FIG. 3 and FIG. 4 show comparative examples.

The example of FIG. 3 differs from that of FIG. 2 in that a metal layer 11' is used instead of the REO layer 11 of FIG. 2. The metal layer 11' includes, for example, Nb, Mo, Ta, Cr, V, Zn, Ru, Hf, or Zr. In this case, as shown in the figure, metal elements in the metal layer 11' diffuse into the crystalline magnetic layer 12 in heat treatment, and thus, the crystallization of the crystalline magnetic layer 12 is thereby inhibited.

The example of FIG. 4 differs from that of FIG. 2 in that a metal nitride layer 11" is used instead of the REO layer 11 of FIG. 2. The metal nitride layer 11" includes, for example, MgN, ZrN, NbN, SiN, AlN, HfN, TaN, WN, CrN, MoN, TiN, or VN. The metal nitride layer 11" may include, for example, an oxygen compound such as MgO. The metal nitride layer 11" may be a ternary compound such as AlTiN. In this case, as shown in the figure, in heat treatment, the metal nitride layer 11" blocks the diffusion of impurities from the amorphous magnetic layer 12', and thus, it is hard to remove the impurities from the amorphous magnetic layer 12'. As a result, a large number of impurities are left in the crystalline magnetic layer 12, and the crystallization of the crystalline magnetic layer 12 cannot be promoted.

As described above, according to the first embodiment, the crystallization of the crystalline magnetic layer 12 can be promoted by the stacked structure of the REO layer 11 and the crystalline magnetic layer 12. The present embodiment is applicable to all semiconductor devices which require a crystalline magnetic layer having a good crystal structure.

Modifications of First Embodiment

FIG. 5 to FIG. 9 show modifications of the first embodiment.

Figure 5:
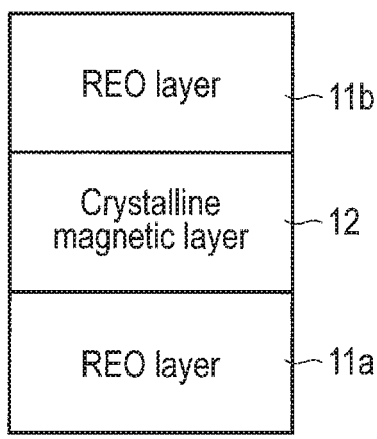
FIG. 5 to FIG. 9 show modifications of the first embodiment.

In the example of FIG. 5, the semiconductor device comprises an REO layer 11a, the crystalline magnetic layer 12 above the REO layer 11a, and an REO layer 11b above the crystalline magnetic layer 12. That is, the crystalline magnetic layer 12 is interposed between the two REO layers 11a and 11b. The REO layers 11a and 11b correspond to the REO layer 11 of FIG. 1A and FIG. 1B.

It is preferable that the crystalline magnetic layer 12 contact the REO layers 11a and 11b. In addition, an interfacial layer may exist in at least one of the space between the REO layer 11a and the crystalline magnetic layer 12 and the space between the REO layer 11b and the crystalline magnetic layer 12. It should be noted that the interfacial layer may exist under the condition that it does not influence the crystallization of the crystalline magnetic layer 12.

In this case, in the crystallization process of the magnetic layer, the impurities in the amorphous magnetic layer can diffuse upward and downward, that is, into both of the REO layers 11a and 11b, and thus, the crystallization of the crystalline magnetic layer 12 can be further promoted.

Figure 6:
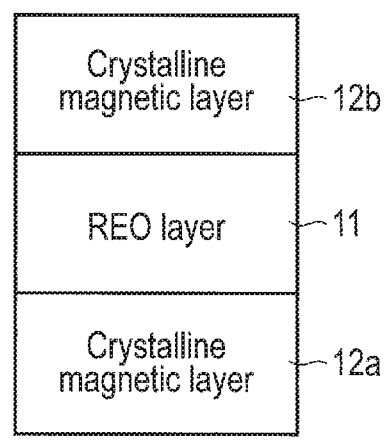

In the example of FIG. 6, the semiconductor device comprises a crystalline magnetic layer 12a, the REO layer 11 above the crystalline magnetic layer 12a, and a crystalline magnetic layer 12b above the REO layer 11. That is, the REO layer 11 is interposed between the two crystalline magnetic layers 12a and 12b. The crystalline magnetic layers 12a and 12b correspond to the crystalline magnetic layer 12 of FIG. 1A and FIG. 1B.

It is preferable that the crystalline magnetic layers 12a and 12b contact the REO layer 11. In addition, an interfacial layer may exist in at least one of the space between the REO layer 11 and the crystalline magnetic layer 12a and the space between the REO layer 11 and the crystalline magnetic layer 12b. It should be noted that the interfacial layer may exist under the condition that it does not influence the crystallization of the crystalline magnetic layers 12a and 12b.

In this case, in the crystallization process of the magnetic layers, the crystalline magnetic layers 12a and 12b each having a good crystal structure can be formed at the same time.

Figure 7:
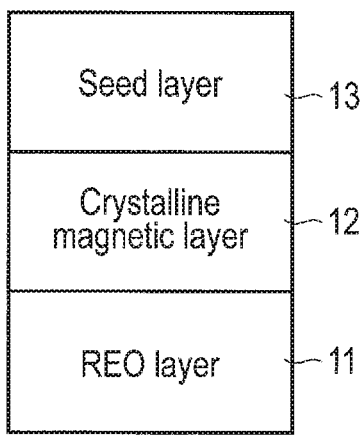

In the example of FIG. 7, the semiconductor device comprises the REO layer 11, the crystalline magnetic layer 12 above the REO layer 11, and a nonmagnetic layer (seed layer) 13 above the crystalline magnetic layer 12. In addition, in the example of FIG. 8, the semiconductor device comprises the nonmagnetic layer (seed layer) 13, the crystalline magnetic layer 12 above the nonmagnetic layer 13, and the REO layer 11 above the crystalline magnetic layer 12.

Figure 8:
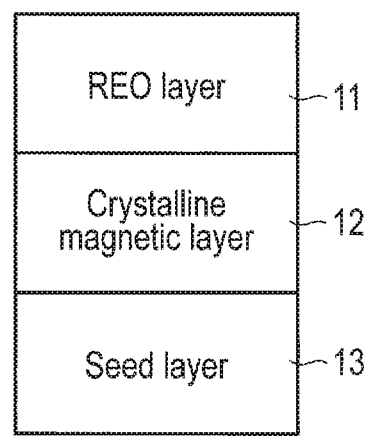

In the examples of FIG. 7 and FIG. 8, the crystalline magnetic layer 12 is interposed between the REO layer 11 and the nonmagnetic layer 13.

It is preferable that the crystalline magnetic layer 12 contact the REO layer 11 and the nonmagnetic layer 13. In addition, an interfacial layer may exist in at least one of the space between the REO layer 11 and the crystalline magnetic layer 12 and the space between the crystalline magnetic layer 12 and the nonmagnetic layer 13. It should be noted that the interfacial layer may exist under the condition that it does not influence the crystallization of the crystalline magnetic layer 12.

In the crystallization process of the magnetic layer, the nonmagnetic layer 13 has a predetermined crystal structure before heat treatment, and performs the function of controlling the orientation of the crystal structure of the crystalline magnetic layer 12 during the heat treatment. That is, in the crystallization process of the magnetic layer, the crystalline magnetic layer 12 grows with the nonmagnetic layer 13 serving as a seed. For example, the crystalline magnetic layer 12 is oriented in the same crystal surface as that of the nonmagnetic layer 13. In this sense, the nonmagnetic layer 13 is referred to as a seed layer.

The nonmagnetic layer 13 may be an insulator or a conductor.

If the nonmagnetic layer 13 is an insulator, the nonmagnetic layer 13 includes, for example, at least one of magnesium oxide, aluminum oxide, zinc oxide, titanium oxide, aluminum nitride, boron nitride, and lanthanum-strontium-manganese oxide (LSMO).

If the nonmagnetic layer 13 is magnesium oxide (MgO), the nonmagnetic layer 13 has an NaCl structure in which the film surface is oriented in a (001) surface. Accordingly, if the crystalline magnetic layer 12 is CoFeB, the crystalline magnetic layer 12 has a body-centered cubic (BCC) structure in which the film surface is oriented in the (001) surface.

In addition, if the nonmagnetic layer 13 is magnesium oxide (MgO) and the crystalline magnetic layer 12 is FePtB, the crystalline magnetic layer 12 has a face centered cubic (FCC) structure in which the film surface is oriented in the (001) surface. Moreover, when the crystalline magnetic layer 12 is subjected to sufficient heat treatment, boron is substantially completely removed from the crystalline magnetic layer 12 and the crystalline magnetic layer 12 has an $L1_O$ structure ($L1_O$-FePt).

In addition, if the nonmagnetic layer 13 is zinc oxide (ZnO), the nonmagnetic layer 13 has a hexagonal Wurtzite structure in which the film surface is oriented in a (0001) surface. Accordingly, if the crystalline magnetic layer 12 is CoPdB, the crystalline magnetic layer 12 has a face centered cubic (FCC) structure in which the film surface is oriented in a (111) surface. Moreover, when the crystalline magnetic layer 12 is subjected to sufficient heat treatment, boron is substantially completely removed from the crystalline magnetic layer 12 and the crystalline magnetic layer 12 has an $L1_1$ structure ($L1_1$-CoPd).

In addition, if the nonmagnetic layer 13 is a conductor, the nonmagnetic layer 13 includes, for example, at least one of Pt, Pd, Rh, Ru, Ir, and Cr.

If the nonmagnetic layer 13 is one of Pt, Pd, and Ir, the nonmagnetic layer 13 has a crystal structure in which the film surface is oriented in a (111) surface. In this case, the crystalline magnetic layer 12 also has a crystal structure in which the film surface is oriented in the (111) surface. In addition, if the nonmagnetic layer 13 is one of Rh and Cr, the nonmagnetic layer 13 has a crystal structure in which the film surface is oriented in a (001) surface. In this case, the crystalline magnetic layer 12 also has a crystal structure in which the film surface is oriented in the (001) surface. Moreover, if the nonmagnetic layer 13 is Ru, the nonmagnetic layer 13 has a crystal structure in which the film surface is oriented in a (0001) surface. In this case, the crystalline magnetic layer 12 also has a crystal structure in which the film surface is oriented in the (0001) surface.

It is preferable that a material included in the nonmagnetic layer (seed layer) 13 is different from a material included in the REO layer 11. Because, a rare-earth oxide generally has a large atomic radius and a complex crystal structure. Therefore, in the case where the nonmagnetic layer 13 having a film thickness of several nm includes, for example, the rare-earth oxide, the nonmagnetic layer 13 has a bad crystalline and does not function as a seed layer (a crystalline orientation layer) of the crystalline magnetic layer 12. In addition, the nonmagnetic layer 13 including the rare-earth oxide is not desirable as a tunnel barrier layer for obtaining a large MR ratio. However, the nonmagnetic layer 13 and the REO layer 11 may include the same element.

As described above, according to the modifications of FIG. 7 and FIG. 8, in the crystallization process of the magnetic layer, the crystalline magnetic layer 12 grows with the nonmagnetic layer 13 serving as a seed. Accordingly, the crystallization of the crystalline magnetic layer 12 can be further promoted.

The modifications of the FIG. 7 and FIG. 8 are effective in controlling the orientation of the crystalline magnetic layer 12 to an orientation other than that in which the surface energy is the smallest. This is because in the case where the orientation of the crystalline magnetic layer 12 is controlled to the orientation in which the surface energy is the smallest, even if the nonmagnetic layer 13 does not exist, the crystalline magnetic layer 12 naturally has the orientation in which the surface energy is the smallest by heat treatment.

The orientation in which the surface energy is the smallest is determined by the material of the crystalline magnetic layer 12, that is, an element included in the crystalline magnetic layer 12, or if the crystalline magnetic layer 12 includes elements, the composition ratio thereof, etc.

Accordingly, if the orientation of the crystalline magnetic layer 12 is controlled to the orientation in which the surface energy is the smallest, the structure of FIG. 1A, FIG. 1B, FIG. 5, or FIG. 6 is preferable. If the orientation of the crystalline magnetic layer 12 is controlled to an orientation other than that in which the surface energy is the smallest, the structure of FIG. 7 or FIG. 8 is preferable.

It should be noted that if the orientation of the crystalline magnetic layer 12 is controlled to the orientation in which the surface energy is the smallest, the structure of FIG. 7 or FIG. 8 may be adopted.

Figure 9:
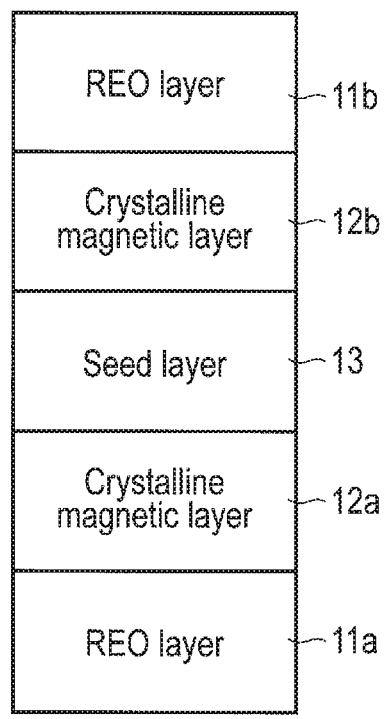

In the example of FIG. 9, the semiconductor device comprises the REO layer 11a, the crystalline magnetic layer 12a above the REO layer 11a, the nonmagnetic layer (seed layer) 13 above the crystalline magnetic layer 12a, the crystalline magnetic layer 12b above the nonmagnetic layer 13, and the REO layer 11b above the crystalline magnetic layer 12b.

In this example, the crystalline magnetic layer 12a is interposed between the REO layer 11a and the nonmagnetic layer 13, and the crystalline magnetic layer 12b is interposed between the nonmagnetic layer 13 and the REO layer 11b.

It is preferable that the crystalline magnetic layer 12a contact the REO layer 11a and the nonmagnetic layer 13. It is preferable that the crystalline magnetic layer 12b contact the nonmagnetic layer 13 and the REO layer 11b.

In addition, an interfacial layer may exist in at least one of the space between the REO layer 11a and the crystalline magnetic layer 12a and the space between the crystalline magnetic layer 12a and the nonmagnetic layer 13. Moreover, an interfacial layer may exist in at least one of the space between the REO layer 11b and the crystalline magnetic layer 12b and the space between the crystalline magnetic layer 12b and the nonmagnetic layer 13. It should be noted that the interfacial layers may exist under the condition that they do not influence the crystallization of the crystalline magnetic layers 12a and 12b.

The example of FIG. 9 is applicable to a magnetoresistive element.

For example, if one of the two crystalline magnetic layers 12a and 12b is a storage layer (free layer) having a variable direction of magnetization, the other is a reference layer (pinned layer) having an invariable direction of magnetization, and the nonmagnetic layer 13 is an insulating layer (tunnel barrier layer), a basic structure of the magnetoresistive element is complete.

Here, the invariable magnetization means that the direction of magnetization does not vary before or after writing, and the variable magnetization means that the direction of magnetization can vary in reverse before or after writing.

In addition, the writing means spin-transfer-torque writing in which a spin-transfer-torque current (spin-polarized electron) is passed to the magnetoresistive element, thereby imparting a spin torque to the magnetization of a storage layer.

It is preferable that the crystalline magnetic layers 12a and 12b have an axis of easy magnetization in a direction perpendicular to the film surface, that is, have the so-called perpendicular magnetic anisotropy. In addition, the crystalline magnetic layers 12a and 12b may have an axis of easy magnetization in a direction parallel to the film surface, that is, the so-called in-plane magnetic anisotropy.

The resistance of the magnetoresistive element varies depending on the relative directions of magnetization of a storage layer and a reference layer because of the magnetoresistive effect. For example, the resistance of the magnetoresistive element is low in a parallel state in which the directions magnetization of the storage layer and the reference layer are the same, and high in an antiparallel state in which the directions of magnetization of the storage layer and the reference layer are opposite to each other.

In this case, each of the two crystalline magnetic layers 12a and 12b includes at least one of Co, Fe, and Ni, and the nonmagnetic layer 13 includes at least one of magnesium oxide, aluminum oxide, zinc oxide, titanium oxide, aluminum nitride, boron nitride, and LSMO. In addition, the two crystalline magnetic layers 12a and 12b are oriented by heat treatment in the same crystal surface as that of the nonmagnetic layer 13.

The indices for evaluating the properties of the magnetoresistive element include an improvement in the magnetoresistive (MR) ratio, a reduction in the switching current, and an improvement in the thermal stability. To achieve them at the same time, it is important to improve the crystalline texture or the magnetic anisotropy of the crystalline magnetic layers (storage layer or reference layer) 12a and 12b.

For that purpose, it is necessary to secure the continuity between the crystal structures of the crystalline magnetic layer 12a and the nonmagnetic layer 13 at the interface thereof, and secure the continuity between the crystal structures of the nonmagnetic layer 13 and the crystalline magnetic layer 12b at the interface thereof. The state in which the continuity between the crystal structures is secured means that the interface between the crystalline magnetic layer 12a and the nonmagnetic layer 13 and the interface between the nonmagnetic layer 13 and the crystalline magnetic layer 12b are each flat and do not have a lattice defect.

In the magnetoresistive element, to secure the continuity between the crystal structures, first, amorphous magnetic layers between which the nonmagnetic layer (crystal structure) 13 is interposed are formed. The amorphous magnetic layers are formed by mixing impurities into magnetic layers. The, by heat treatment, the impurities in the amorphous magnetic layers are removed, and the crystalline magnetic layers 12a and 12b are formed.

At this time, the impurities in the amorphous layers move from the nonmagnetic layer 13 side to the REO layers 11a and 11b side and diffuse into the REO layers 11a and 11b. The impurities are easily removed by using the REO layers 11a and 11b. In addition, any elements do not diffuse from the REO layers 11a and 11b into the amorphous magnetic layers.

Accordingly, in the amorphous magnetic layers, crystallization progresses successively from the nonmagnetic layer 13 side with the nonmagnetic layer 13 serving as a seed. According to the above-described principle, the continuity between the crystal structures is secured.

In FIG. 9, like FIG. 7 and FIG. 8, it is preferable that a material included in the nonmagnetic layer (seed layer) 13 is different from a material included in the REO layer 11a, 11b. However, the nonmagnetic layer 13 and the REO layer 11a, 11b may include the same element.

As described above, the crystalline texture or the magnetic anisotropy of the magnetoresistive element can be improved by applying the structure of FIG. 9 to the magnetoresistive element. Accordingly, an improvement in the MR ratio, a reduction in the switching current, and an improvement in the thermal stability of the magnetoresistive element can be achieved.

Second Embodiment

Figure 10A:
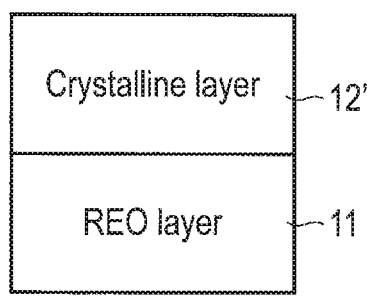
FIG. 10A and FIG. 10B show a second embodiment.
Figure 10B:
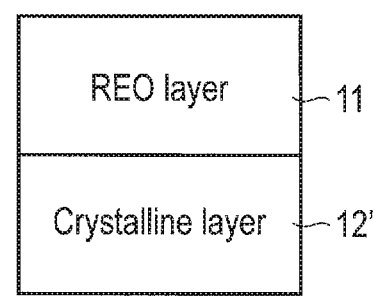

FIG. 10A and FIG. 10B show a semiconductor device according to a second embodiment.

In the example of FIG. 10A, the semiconductor device comprises an REO layer 11 and a crystalline layer 12' above the REO layer 11. In the example of FIG. 10B, the semiconductor device comprises the crystalline layer 12' and the REO layer 11 above the crystalline layer 12'.

In both of the examples, the crystalline layer 12' is adjacent to the REO layer 11. It is preferable that the crystalline layer 12' contact the REO layer 11. In addition, an interfacial layer may exist between the REO layer 11 and the crystalline layer 12'. It should be noted that, as will be described later, the interfacial layer may exist under the condition that it does not influence the crystallization of the crystalline layer 12'.

The REO layer 11 includes at least one of Tb, Gd, Nd, Y, Sm, Pm, Tm, Sc, Ce, Eu, Er, Ho, La, Yb, Lu, Pr, and Dy.

The crystalline layer 12' may be a conductor, an insulator, or a semiconductor.

If the crystalline layer 12' is a conductor, the crystalline layer 12' includes a metal element such as W, Al, or Cu. In addition, the crystalline layer 12' may be a magnetic material. In this case, the crystalline layer 12' includes at least one of Co, Fe, and Ni.

The REO layer 11 and the crystalline layer 12' include the same impurities. The same impurities are, for example, at least one of B, P, C, Al, Mn, Si, Ta, W, Mo, Cr, Hf, and Ti.

According to the above-described semiconductor device, the crystallization of the crystalline layer 12' can be promoted.

A principle on which the crystallization of the crystalline layer 12' is promoted is the same as that of the first embodiment (see FIG. 2 to FIG. 4), and a description thereof is herein omitted.

As described above, also in the second embodiment, as in the first embodiment, the crystallization of the crystalline layer 12' can be promoted by the stacked structure of the REO layer 11 and the crystalline layer 12'. The present embodiment is applicable to all semiconductor devices which require a crystalline magnetic layer having a good crystal structure.

Modifications of Second Embodiment

FIG. 11 to FIG. 15 show modifications of the second embodiment.

Figure 11:
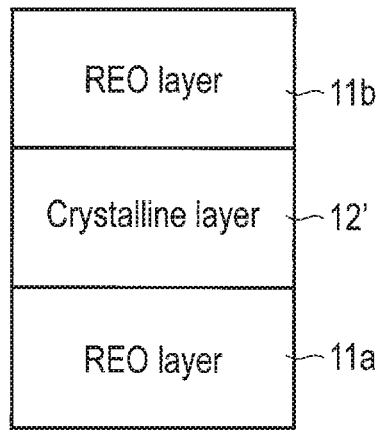
FIG. 11 to FIG. 15 show modifications of the second embodiment.

In the example of FIG. 11, the semiconductor device comprises an REO layer 11a, the crystalline layer 12' above the REO layer 11a, and an REO layer 11b above the crystalline layer 12'. That is, the crystalline layer 12' is interposed between the two REO layers 11a and 11b. The REO layers 11a and 11b correspond to the REO layer 11 of FIG. 10A and FIG. 10B.

It is preferable that the crystalline layer 12' contact the REO layers 11a and 11b. In addition, an interfacial layer may exist in at least one of the space between the REO layer 11a and the crystalline layer 12' and the space between the REO layer 11b and the crystalline layer 12'. It should be noted that the interfacial layer may exist under the condition that it does not influence the crystallization of the crystalline layer 12'.

In this case, in the crystallization process of the crystalline layer 12', the impurities in the amorphous magnetic layer can diffuse upward and downward, that is, into both of the REO layers 11a and 11b, and thus, the crystallization of the crystalline layer 12' can be further promoted.

Figure 12:
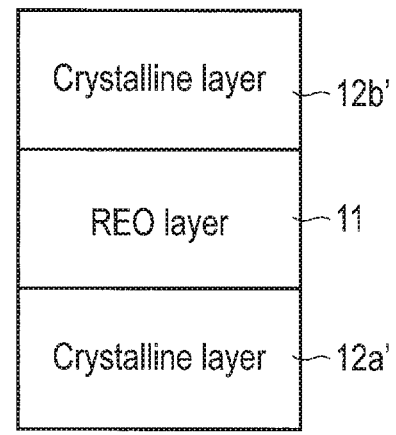

In the example of FIG. 12, the semiconductor device comprises a crystalline layer 12a', the REO layer 11 above the crystalline layer 12a', and a crystalline layer 12b' above the REO layer 11. That is, the REO layer 11 is interposed between the two crystalline layers 12a' and 12b'. The crystalline layers 12a' and 12b' correspond to the crystalline layer 12 of FIG. 10A and FIG. 10B.

It is preferable that the crystalline layers 12a' and 12b' contact the REO layer 11. In addition, an interfacial layer may exist in at least one of the space between the REO layer 11 and the crystalline layer 12a' and the space between the REO layer 11 and the crystalline layer 12b'. It should be noted that the interfacial layer may exist under the condition that it does not influence the crystallization of the crystalline layers 12a' and 12b'.

In this case, in the crystallization process of the crystalline layers 12a' and 12b', the crystalline layers 12a' and 12b' each having a good crystal structure can be formed at the same time.

Figure 13:
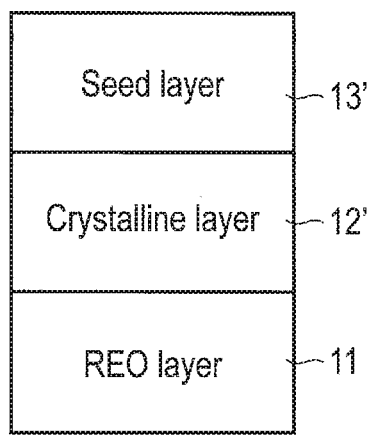

In the example of FIG. 13, the semiconductor device comprises the REO layer 11, the crystalline layer 12' above the REO layer 11, and a seed layer (crystalline layer) 13' above the crystalline layer 12'. In addition, in the example of FIG. 14, the semiconductor device comprises the seed layer 13', the crystalline layer 12' above the seed layer 13', and the REO layer 11 above the crystalline layer 12'.

Figure 14:
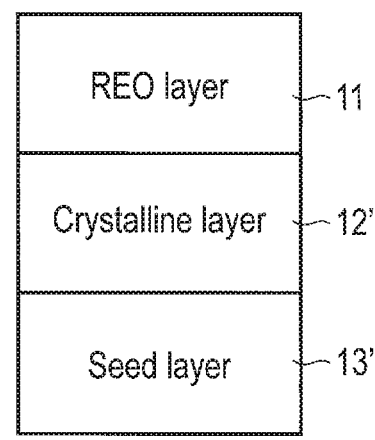

In the examples of FIG. 13 and FIG. 14, the crystalline layer 12' is interposed between the REO layer 11 and the seed layer 13'.

It is preferable that the crystalline layer 12' contact the REO layer 11 and the seed layer 13'. In addition, an interfacial layer may exist in at least one of the space between the REO layer 11 and the crystalline layer 12' and the space between the crystalline layer 12' and the seed layer 13'. It should be noted that the interfacial layer may exist under the condition that it does not influence the crystallization of the crystalline layer 12'.

In the crystallization process of the crystalline layer 12', the seed layer 13' has a predetermined crystal structure before heat treatment, and performs the function of controlling the orientation of the crystal structure of the crystalline magnetic layer 12' during the heat treatment. That is, in the crystallization process of the crystalline layer 12', the crystalline layer 12' grows with the seed layer 13' serving as a seed. For example, the crystalline layer 12' is oriented in the same crystal surface as that of the seed layer 13'.

The seed layer 13' may be an insulator or a conductor.

If the seed layer 13' is an insulator, the seed layer 13' includes, for example, at least one of magnesium oxide, aluminum oxide, zinc oxide, titanium oxide, aluminum nitride, boron nitride, and lanthanum-strontium-manganese oxide (LSMO).

In addition, if the seed layer 13' is a conductor, the seed layer 13' includes, for example, at least one of Pt, Pd, Rh, Ru, Ir, and Cr.

If the seed layer 13' is one of Pt, Pd, and Ir, the seed layer 13' has a crystal structure in which the film surface is oriented in a (111) surface. In this case, the magnetic layer 12' also has a crystal structure in which the film surface is oriented in the (111) surface. In addition, if the seed layer 13' is one of Rh and Cr, the seed layer 13' has a crystal structure in which the film surface is oriented in a (001) surface. In this case, the crystalline layer 12' also has a crystal structure in which the film surface is oriented in the (001) surface. Moreover, if the seed layer 13' is Ru, the seed layer 13' has a crystal structure in which the film surface is oriented in a (0001) surface. In this case, the crystalline layer 12' also has a crystal structure in which the film surface is oriented in the (0001) surface.

In FIG. 13 and FIG. 14, like FIG. 7 and FIG. 8, it is preferable that a material included in the seed layer 13' is different from a material included in the REO layer 11. However, the seed layer 13' and the REO layer 11 may include the same element.

As described above, according to the modifications of FIG. 13 and FIG. 14, in the crystallization process of the crystalline layer 12', the crystalline layer 12' grows with the seed layer 13' serving as a seed. Accordingly, the crystallization of the crystalline layer 12' can be further promoted.

The modifications of the FIG. 13 and FIG. 14 are effective in controlling the orientation of the crystalline layer 12' to an orientation other than that in which the surface energy is the smallest. This is because in the case where the orientation of the crystalline layer 12' is controlled to the orientation in which the surface energy is the smallest, even if the seed layer 13' does not exist, the crystalline layer 12' naturally has the orientation in which the surface energy is the smallest by heat treatment.

The orientation in which the surface energy is the smallest is determined by the material of the crystalline layer 12', that is, an element included in the crystalline layer 12', or if the crystalline layer 12' includes elements, the composition ratio thereof, etc.

Accordingly, if the orientation of the crystalline layer 12' is controlled to the orientation in which the surface energy is the smallest, the structure of FIG. 10A, FIG. 10B, FIG. 11, or FIG. 12 is preferable. If the orientation of the crystalline layer 12' is controlled to an orientation other than that in which the surface energy is the smallest, the structure of FIG. 13 or FIG. 14 is preferable.

It should be noted that if the orientation of the crystalline layer 12' is controlled to the orientation in which the surface energy is the smallest, the structure of FIG. 13 or FIG. 14 may be adopted.

Figure 15:
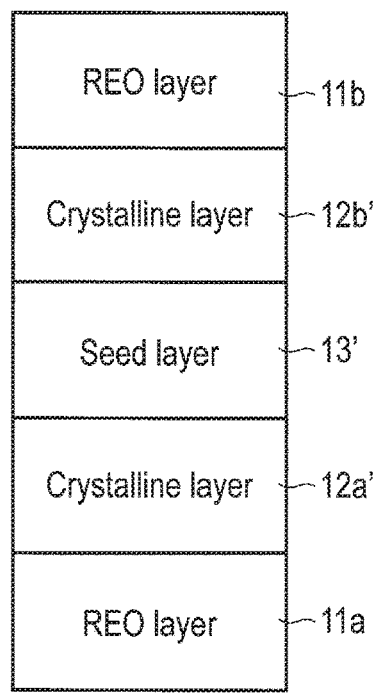

In the example of FIG. 15, the semiconductor device comprises the REO layer 11a, the crystalline layer 12a' above the REO layer 11a, the seed layer 13' above the crystalline layer 12a,' the crystalline layer 12b' above the seed layer 13', and the REO layer 11b above the crystalline layer 12b'.

In this example, the crystalline layer 12a' is interposed between the REO layer 11a and the seed layer 13', and the crystalline layer 12b' is interposed between the seed layer 13' and the REO layer 11b.

It is preferable that the crystalline layer 12a' contact the REO layer 11a and the seed layer 13'. It is preferable that the crystalline layer 12b' contact the seed layer 13' and the REO layer 11b.

In addition, an interfacial layer may exist in at least one of the space between the REO layer 11a and the crystalline layer 12a' and the space between the crystalline layer 12a' and the seed layer 13'. In addition, an interfacial layer may exist in at least one of the space between the REO layer 11b and the crystalline layer 12b' and the space between the crystalline layer 12b' and the seed layer 13'. It should be noted that the interfacial layers may exist under the condition that they do not influence the crystallization of the crystalline layers 12a' and 12b'.

In FIG. 15, like FIG. 7 and FIG. 8, it is preferable that a material included in the seed layer 13' is different from a material included in the REO layer 11a, 11b. However, the seed layer 13' and the REO layer 11a, 11b may include the same element.

As described above, according to the modification of FIG. 15, the crystallization of the crystalline layers 12a' and 12b' progresses successively from the seed layer 13' side with the seed layer 13' serving as a seed. According to the above-described principle, the continuity between the crystal structures is secured.

Third Embodiment

Figure 16:
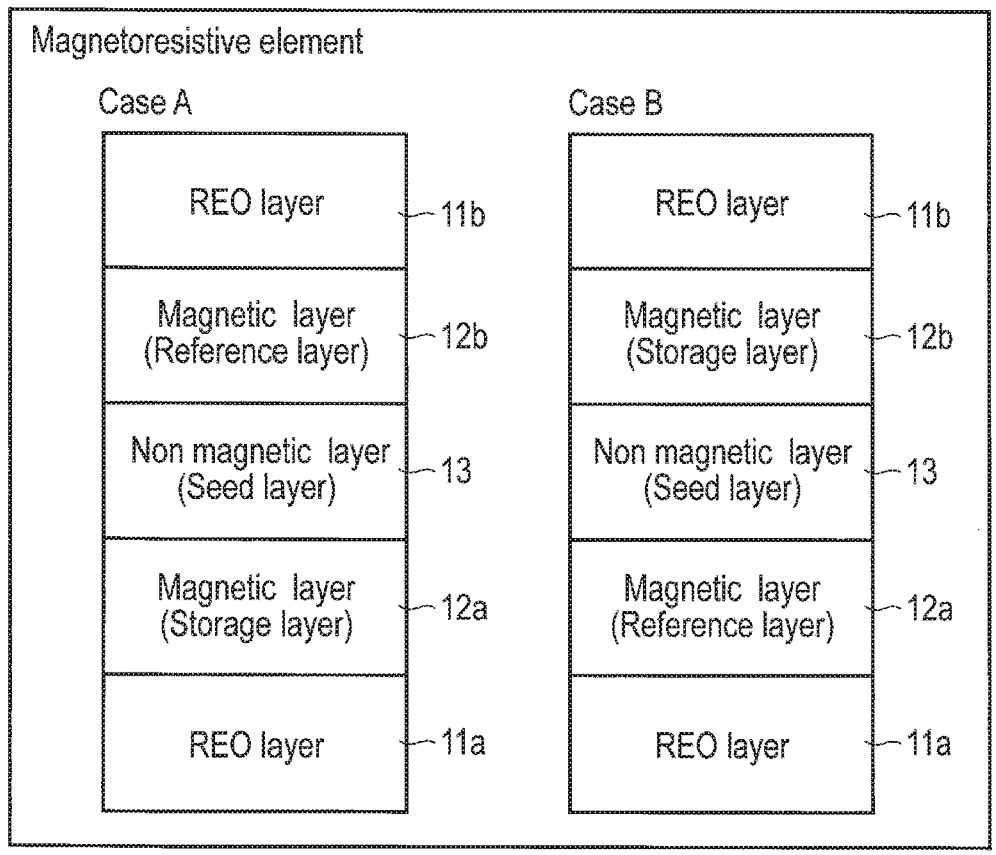
FIG. 16 shows a third embodiment.

FIG. 16 shows a third embodiment.

In the present embodiment, the structure of FIG. 9, which is a modification of the first embodiment, is applied to a magnetoresistive element.

A semiconductor device comprises an REO layer 11a, a crystalline magnetic layer 12a above the REO layer 11a, a nonmagnetic layer (seed layer) 13 above the crystalline magnetic layer 12a, a crystalline magnetic layer 12b above the nonmagnetic layer 13, and an REO layer 11b above the crystalline magnetic layer 12b.

Case A is an example of the magnetoresistive element in which the crystalline magnetic layer 12a is a storage layer and the crystalline magnetic layer 12b is a reference layer, that is, a top-pin type magnetoresistive element. Case B is an example of the magnetoresistive element in which the crystalline magnetic layer 12a is a reference layer and the crystalline magnetic layer 12b is a storage layer, that is, a bottom-pin type magnetoresistive element.

The crystalline magnetic layers 12a and 12b include at least one of Co, Fe, and Ni. The crystalline magnetic layers 12a and 12b are, for example, CoFeB, FePtB, CoPdB, CoPtB, or NiPtB. The nonmagnetic layer 13 includes at least one of magnesium oxide, aluminum oxide, zinc oxide, titanium oxide, aluminum nitride, boron nitride, and LSMO. In addition, the crystalline magnetic layers 12a and 12b are oriented by heat treatment in the same crystal surface as that of the nonmagnetic layer 13.

In the third embodiment, it is preferable that a material included in the nonmagnetic layer (seed layer) 13 is different from a material included in the REO layer 11a, 11b. However, the nonmagnetic layer (seed layer) 13 and the REO layer 11a, 11b may include the same element.

According to the third embodiment, the crystalline texture or the magnetic anisotropy of the magnetoresistive element can be improved. Accordingly, an improvement in the MR ratio, a reduction in the switching current, and an improvement in the thermal stability of the magnetoresistive element can be achieved.

Fourth Embodiment

Figure 17:
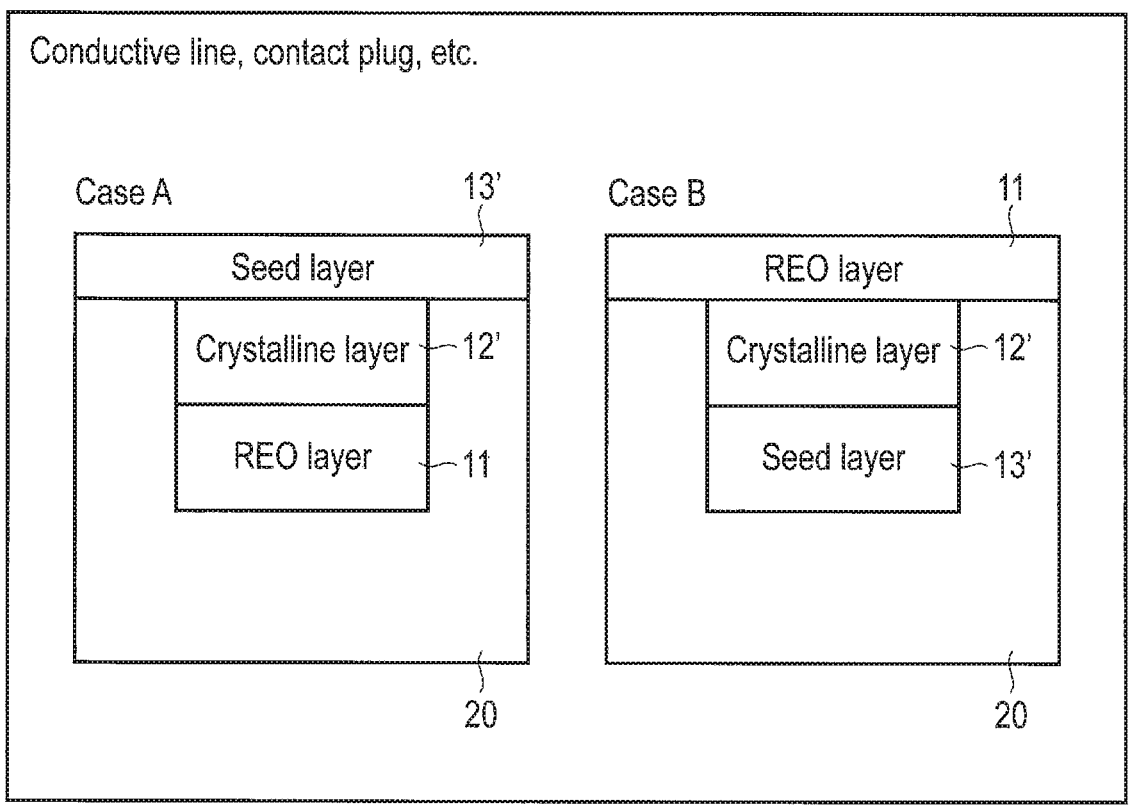
FIG. 17 shows a fourth embodiment.

FIG. 17 shows a fourth embodiment.

In the present embodiment, the structure of FIG. 13 or FIG. 14, which is a modification of the second embodiment, is applied to one of the elements of a semiconductor device, such as a conductive line or a contact plug.

The semiconductor device comprises an underlayer 20, an REO layer 11 disposed in a depression in the underlayer 20 or above the underlayer 20, a crystalline layer 12', and a seed layer 13'. The underlayer 20 is, for example, a semiconductor substrate or an interlayer insulating layer.

In case A, the semiconductor device comprises the REO layer 11 and the crystalline layer 12' above the REO layer 11 in the depression in the underlayer 20. In addition, the semiconductor device comprises the seed layer 13' above the crystalline layer 12' and the underlayer 20.

In case B, the semiconductor device comprises the seed layer 13' and the crystalline layer 12' above the seed layer 13' in the depression of the underlayer 20. In addition, the semiconductor device comprises the REO layer 11 above the crystalline layer 12' and the underlayer 20.

The crystalline layer 12' includes, for example, a metal element such as W, Al, or Cu. The seed layer 13' includes at least one of Pt, Pd, Rh, Ru, Ir, and Cr. In addition, the crystalline layer 12' is oriented by heat treatment in the same crystal surface as that of the seed layer 13'.

In the fourth embodiment, it is preferable that a material included in the seed layer 13' is different from a material included in the REO layer 11. However, the seed layer 13' and the REO layer 11 may include the same element.

According to the fourth embodiment, the crystalline texture of one of the elements of the semiconductor device which requires a good crystalline layer, such as a conductive line or a contact plug, can be improved. Accordingly, the properties of the semiconductor device can be improved.

Fifth Embodiment

A fifth embodiment relates to a memory device comprising a magnetoresistive element.

Figure 18:
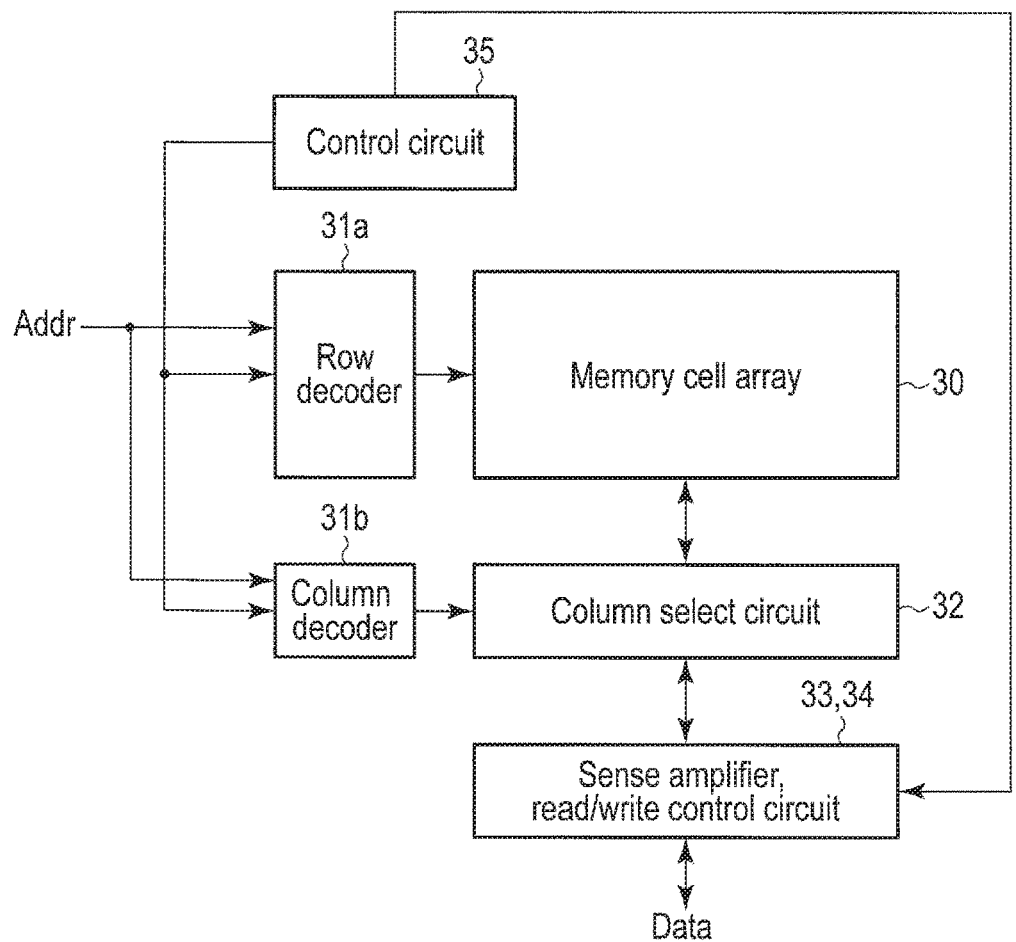
FIG. 18 shows a fifth embodiment.

FIG. 18 shows an MRAM as the memory device.

A memory cell array 30 comprises memory cells (magnetoresistive elements). A row decoder 31a and a column decoder 31b randomly access one of the memory cells of the memory cell array 30 based on an address signal Addr.

A column select circuit 32 has the function of electrically connecting the memory cell array 30 and a sense amplifier 33 to each other based on a signal from the column decoder 31b.

At the time of reading, a read/write control circuit 34 supplies a read current to one selected memory cell of the memory cell array 30. The sense amplifier 33 detects the read current, thereby identifying data stored in the one selected memory cell.

In addition, at the time of writing, the read/write control circuit 34 supplies a write current to one selected memory cell of the memory cell array 30, thereby writing data to the one selected memory cell.

A control circuit 35 controls the operation of the row decoder 31a, the column decoder 31b, the sense amplifier 33, and the read/write control circuit 34.

Figure 19:
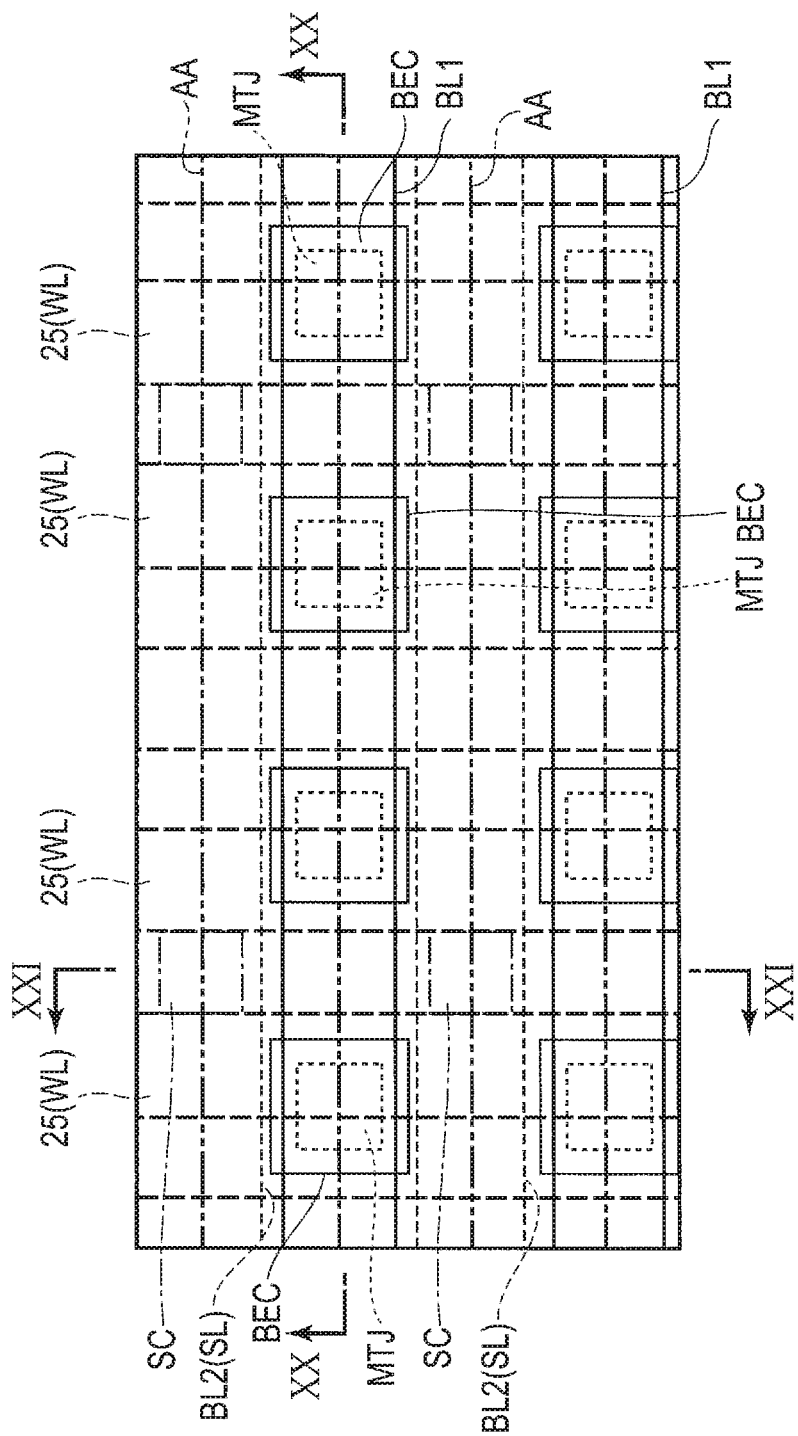
FIG. 19 shows memory cells of an MRAM.
Figure 20:
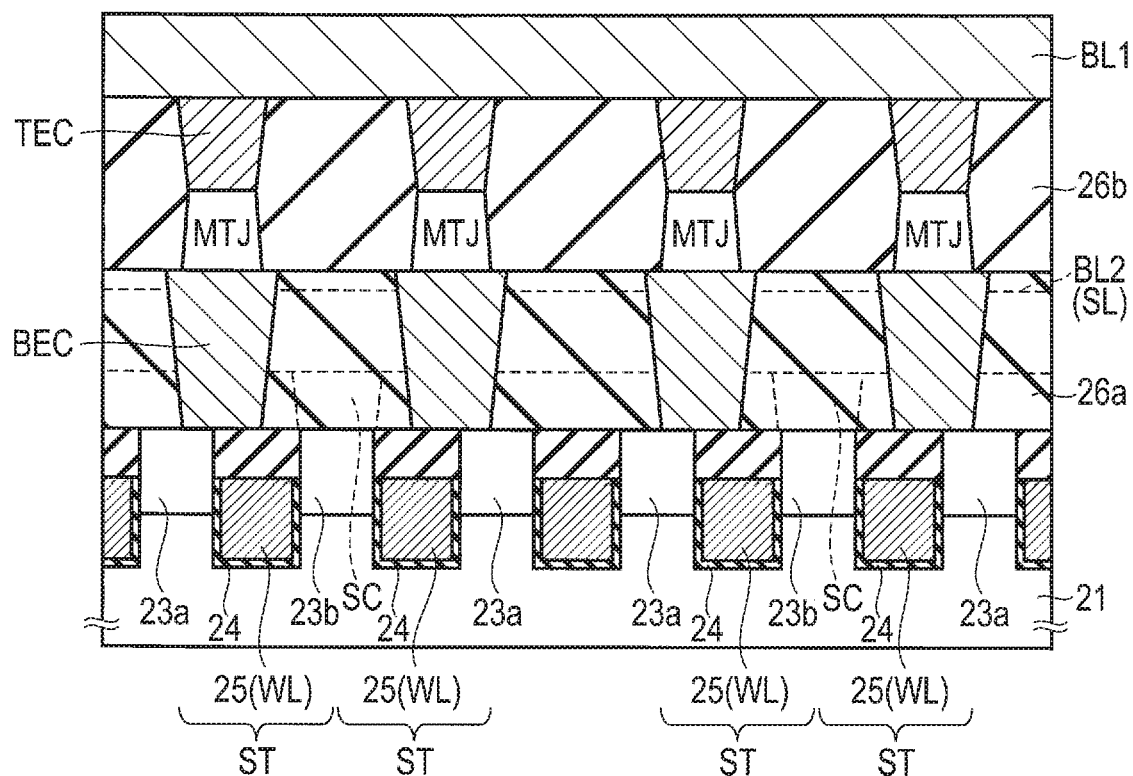
FIG. 20 is a sectional view along line XX-XX of FIG. 19.
Figure 21:
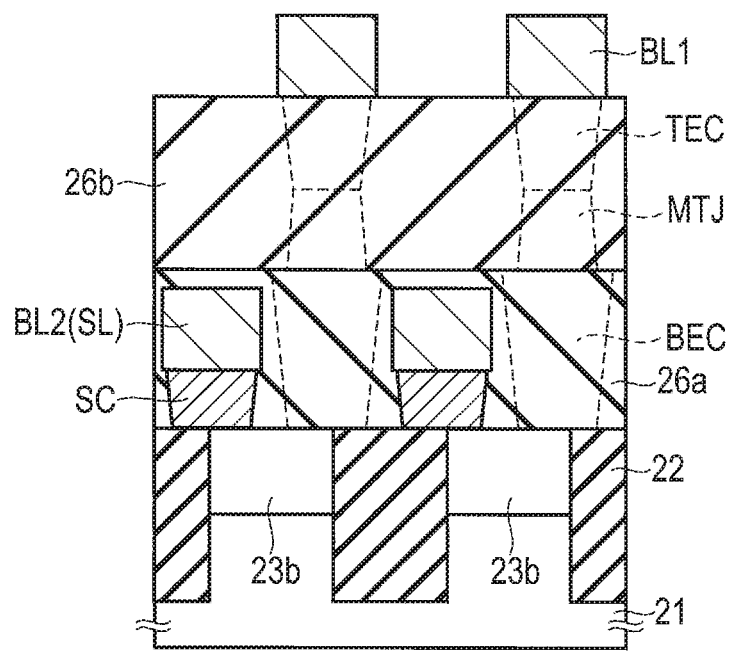
FIG. 21 is a sectional view along line XXI-XXI of FIG. 19.

FIG. 19 to FIG. 21 show the memory cells of the MRAM. FIG. 19 is a plan view of the memory cells of the MRAM. FIG. 20 is a sectional view along line XX-XX of FIG. 19. FIG. 21 is a sectional view along line XXI-XXI of FIG. 19.

In the present embodiment, the memory cells of the magnetic memory each comprise a select transistor (for example, an FET) ST and a magnetoresistive element MTJ.

The select transistor ST is disposed in an active area AA in a semiconductor substrate 21. The active area AA is surrounded by an element isolation insulating layer 22 in the semiconductor substrate 21. In the present example, the element isolation insulating layer 22 has a shallow trench isolation (STI) structure.

The select transistor ST comprises source/drain diffusion layers 23a and 23b in the semiconductor substrate 21, a gate insulating layer 24 and a gate electrode (word line) 25 formed therebetween in the semiconductor substrate 21. The select transistor ST of the example has the so-called buried gate structure in which the gate electrode 25 is buried in the semiconductor substrate 21.

The structure of the fourth embodiment (FIG. 17) is applicable to the gate electrode 25.

An interlayer insulating layer (for example, a silicon oxide layer) 26a covers the select transistor ST. Contact plugs BEC and SC are disposed in the interlayer insulating layer 26a. The contact plug BEC is connected to the source/drain diffusion layer 23a, and the contact plug SC is connected to the source/drain diffusion layer 23b. The contact plugs BEC and SC include, for example, one of W, Ta, Ru, Ti, TiN, and TaN.

The structure of the fourth embodiment (FIG. 17) is applicable to the contact plugs BEC and SC.

The magnetoresistive element MTJ is disposed on the contact plug BEC. For example, it is preferable that the magnetoresistive element MTJ have the structure of the third embodiment (FIG. 16).

A contact plug TEC is disposed on the magnetoresistive element MTJ. The contact plug TEC includes, for example, one of W, Ta, Ru, Ti, TiN, and TaN. An interlayer insulating layer (for example, a silicon oxide layer) 26b covers the magnetoresistive element MTJ.

A bit line BL1 is connected to the magnetoresistive element MTJ via the contact plug TEC. A bit line BL2 is connected to the source/drain diffusion layer 23b via the contact plug SC. The bit line BL2 also functions as, for example, a source line SL to which a ground potential is applied at the time of reading.

FIG. 22 and FIG. 23 show a method of manufacturing the MRAM of FIG. 19 to FIG. 21.

First, as shown in FIG. 22, the select transistor ST having a buried gate structure is formed in the semiconductor substrate 21. In addition, the interlayer insulating layer 26a is formed, and the contact plug BEC is formed in the interlayer insulating layer 26a.

Then, a stacked structure comprising an REO layer 11a, an amorphous magnetic layer 12a-α, a nonmagnetic layer (seed layer) 13, an amorphous magnetic layer 12b-α, and an REO layer 11b is formed on the interlayer insulating layer 26a and the contact plug BEC.

Then, the amorphous magnetic layers 12a-α and 12b-α are crystallized by, for example, lamp annealing. At this time, since the REO layers 11a and 11b exist, the impurities in the amorphous magnetic layers 12a-α and 12b-α are substantially completely removed. In addition, any elements do not diffuse from the REO layers 11a and 11b into the amorphous magnetic layers 12a-α and 12b-α. Accordingly, the amorphous magnetic layers 12a-α and 12b-α can be changed well into crystalline magnetic layers 12a and 12b.

Next, as shown in FIG. 23, the magnetoresistive element MTJ is patterned by a photoengraving process (PEP) and an RIE process. The REO layer 11b, the crystalline magnetic layer 12b, the nonmagnetic layer 13, the crystalline magnetic layer 12a, and the REO layer 11a are etched successively by physical etching, for example, ion beam etching (IBE).

Then, as shown in FIG. 20, elements such as the interlayer insulating layer 26b, the contact plug TEC, and the bit line BL1 are formed, whereby the MRAM of FIG. 19 to FIG. 21 is complete.

Application Example

It is required that a processor used in a personal digital assistant have low power consumption. One of the methods of reducing the power consumption of the processor is a method of replacing a static random access memory (SRAM)-based cache memory having high standby power consumption with a nonvolatile semiconductor memory in which a nonvolatile element is used.

To be specific, the leakage power of an SRAM tends to be greater both during an operating time and a standby (non-operating) time, as a transistor is miniaturized. Thus, by replacing the cache memory with the nonvolatile semiconductor memory, power supply can be shut off during the standby time, and the power consumption during the standby time can be reduced.

Therefore, a low power consumption processor can be achieved by, for example, using the above-described magnetic random access memory (MRAM) as a cache memory.

Figure 24:
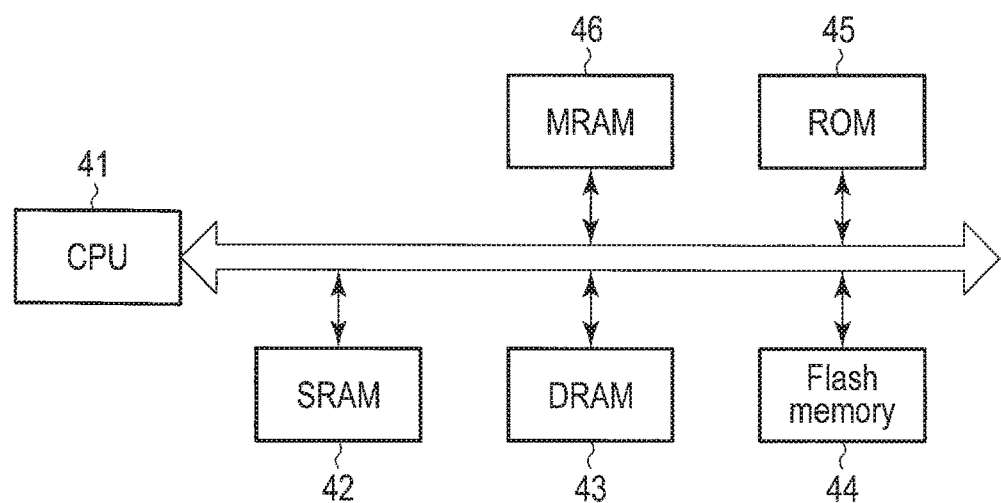
FIG. 24 shows an example of a memory system.

FIG. 24 shows an example of a low power consumption processor system.

A CPU 41 controls an SRAM 42, a DRAM 43, a flash memory 44, a ROM 45, and a magnetic random access memory (MRAM) 46.

The MRAM 46 can be used as an alternative to any of the SRAM 42, the DRAM 43, the flash memory 44, and the ROM 45. With this, at least one of the SRAM 42, the DRAM 43, the flash memory 44, and the ROM 45 may be omitted.

The MRAM 46 can be used as a nonvolatile cache memory (for example, an L2 cache).

The MRAM 46 also can be used as a storage class memory (SCM).

CONCLUSION

As described above, according to the embodiments, in a semiconductor device which requires a crystalline layer, the crystallization of the crystalline layer can be promoted. Accordingly, for example, in a magnetoresistive element, the crystalline texture or the magnetic anisotropy of a crystalline magnetic layer can be improved. Accordingly, an improvement in the MR ratio, a reduction in the switching current, and an improvement in the thermal stability of the magnetoresistive element can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first rare earth oxide layer;
a first magnetic layer adjacent to the first rare earth oxide layer;
a second rare earth oxide layer;
a second magnetic layer adjacent to the second rare earth oxide layer; and
a nonmagnetic layer,
wherein:
the first magnetic layer is disposed between the first rare earth oxide layer and the nonmagnetic layer and is oriented in a crystal surface which is the same as a crystal surface of the nonmagnetic layer,
the second magnetic layer is disposed between the second rare earth oxide layer and the nonmagnetic layer and is oriented in a crystal surface which is the same as a crystal surface of the nonmagnetic layer,
the nonmagnetic layer is disposed between the first magnetic layer and the second magnetic layer,
the first magnetic layer and the first rare earth oxide layer contain a same element, and
the same element is at least one of B, P, C, Ta, W, Cr, Hf and Ti.1

2. The device of claim 1, wherein:
the second magnetic layer and the second rare earth oxide layer contain a same element, and
the same element is at least one of B, P, C, Mn, Ta, W, Cr, Hf and Ti.

3. The device of claim 1, wherein:
the first magnetic layer contacts the first rare earth oxide layer, and
the second magnetic layer contacts the second rare earth oxide layer.

4. The device of claim 1, wherein a material included in the nonmagnetic layer is different from a material included in the first rare earth oxide layer and a material included in the second rare earth oxide layer.

5. The device of claim 4, wherein the nonmagnetic layer includes at least one of magnesium oxide, aluminum oxide, zinc oxide, titanium oxide, aluminum nitride, boron nitride and lanthanum-strontium-manganese oxide (LSMO).

6. The device of claim 1, further comprising:
a transistor; and
a plug,
wherein:
the first rare earth oxide layer, the first magnetic layer, the second rare earth oxide layer, the second magnetic layer and the nonmagnetic layer are included in a magnetoresistive element, and
the magnetoresistive element is connected to the transistor via the plug.

7. The device of claim 1, wherein the first rare earth oxide layer, the first magnetic layer, the second rare earth oxide layer, the second magnetic layer and the nonmagnetic layer form a magnetoresistive element to which data can be written.

8. The device of claim 1, wherein the first rare earth oxide layer includes at least one of Tb, Gd, Nd, Sm, Pm, Tm, Ce, Eu, Er, Ho, Yb, Lu, and Dy.

9. The device of claim 1, wherein the second rare earth oxide layer includes at least one of Tb, Gd, Nd, Sm, Pm, Tm, Ce, Eu, Er, Ho, Yb, Lu and Dy.

* * * * *